United States Patent
Kuo

(10) Patent No.: US 7,064,985 B2
(45) Date of Patent: Jun. 20, 2006

(54) SOURCE LINE DRIVER

(75) Inventor: Cheng-Hsiung Kuo, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 217 days.

(21) Appl. No.: 10/854,819

(22) Filed: May 27, 2004

(65) Prior Publication Data

US 2005/0265085 A1 Dec. 1, 2005

(51) Int. Cl.
*G11C 16/12* (2006.01)
(52) U.S. Cl. .............................. 365/185.23; 365/185.33
(58) Field of Classification Search ........... 365/185.23, 365/185.33, 185.18
See application file for complete search history.

(56) References Cited

U.S. PATENT DOCUMENTS 6,285,608 B1 * 9/2001 Roohparvar ................ 365/201
6,608,782 B1 * 8/2003 Hirano ................... 365/189.09
6,909,641 B1 * 6/2005 Naso et al. ............. 365/185.33

* cited by examiner

Primary Examiner—Andrew Q. Tran
(74) Attorney, Agent, or Firm—Thomas, Kayden, Horstemeyer & Risley

(57) ABSTRACT

A source line driver for a flash memory includes a plurality of source driving units and a control circuit to drive a plurality of source lines. Each source line is coupled to memory cells in a row. Each source driving unit drives the corresponding source line and is coupled to the control circuit at a common node. The control circuit is coupled between the common node. The control circuit is coupled between the common node and a ground line. When any memory cell is assigned to execute a program operation, the control circuit isolates the common node and the ground. When the memory cells are not assigned to execute the program operation, the control circuit couples the common node to the ground line.

20 Claims, 5 Drawing Sheets

SOURCE LINE DRIVER

BACKGROUND OF THE INVENTION

1. Field of the Invention

The present invention relates to a source line driver, and in particular to a source line driver for a flash memory capable of driving sources lines while occupying a relatively small area of the flash memory.

2. Description of the Related Art

FIG. 1 is a basic structure diagram of a conventional flash memory. The flash memory is composed of a plurality of memory cells for memorizing and other control components. The memory cells $10_{0,0} \ldots 10_{2n-1,m-1}$ are disposed in an array and constitute a memory array 10. Each memory cell (as labeled "101" in FIG. 1) has a memory transistor to store logic level "1" or "0". In the memory array 10, each word line selects the memory cells in a column. When receiving a row address signal, a word line decoder 11 enables one word line to select the memory cells in the corresponding row. When receiving a column address signal, a bit line decoder 12 drives one bit line to select the memory cells in the corresponding column. According to the row address signal and the column address signal, a selected memory cell can execute read, program, and erase operations. Moreover, as shown in FIG. 1, source lines $SL1_0 \ldots SL1_{n-1}$ are coupled to a source line driver 13 and extend therefrom in the direction of the word line decoder 11. Each source line applies voltage to the memory cells in two corresponding rows. For example, the memory cells $10_{0,0} \ldots 10_{0,m-1}$ and $10_{1,0} \ldots 10_{1,m-1}$ are coupled to the source line $SL1_0$ and receive voltage therefrom. In the read, program or erase operations, different states of the source line driver 13.

FIG. 2 shows an equivalent circuit of the memory units of the conventional flash memory, the memory cells $10_{0,0}$ and $10_{0,1}$ are taken as an example. Control gates of memory cells $10_{0,0}$ and $10_{0,1}$ are respectively coupled to the word lines $WL1_0$ and $WK1_1$, both drain terminals thereof are coupled to the bit line $BL1_0$ and $WL1_1$, both drain terminals thereof terminals thereof are coupled to the source line $SL1_0$. The source line $SL1_0$ applies voltage to the memory cells $10_{0,0}$ and $10_{0,1}$.

FIG. 3 is a schematic diagram of the conventional source line driver of the conventional flash memory. As shown in FIG. 3, the source line driver 13 comprises a plurality of source line driving units, and one source line driving unit controls one source line. Each source line driving unit comprises three portions.

Taking the source line driving unit $13_0$ as an example, the source line driving unit $13_0$ controls the source line $SL1_0$ applying voltage to the memory cells $10_{0,0} \ldots 10_{0,m-1}$ and $10_{1,0} \ldots 10_{1,m-1}$. The source line driving unit $13_0$ comprises a first circuit $131_0$ having transistor $N13_0$, $N14_0$, and $N15_0$, a second circuit $132_0$, serving as a latch circuit, having inverter $I11_0$ and $I12_0$, and a third circuit $133_0$ having transistor $N11_0$ and $N12_0$. Because a gate of the transistor $N11_0$ is coupled to a voltage source VDD1 having a VDD, the transistor $N11_0$ remains turned on. VDD is the operating voltage of the core circuit, which can be 3.3 V, 2.5 V, or 1.8 V in a semiconductor manufacture process. Also VDD is not the program voltage having a value between 10 V to 12 V.

In read and erase operations $N13_0$ turns off due to P1 having GND level. When word lines are not selected during program operation, the transistors $N14_0$ and $N15_0$ are turned off. A gate of the transistor $N12_0$ receives a signal PL1 having a VDD to turn on the transistor $N12_0$. Therefore, the source line $SL1_0$ is coupled to a ground GND1 through the transistors $N11_0$ and $N12_0$. In read operation, in order to read data, the gate of the transistor $N12_0$ receives the signal PL1 having a VDD to turn on the transistor $N12_0$, the source line $SL1_0$ is coupled to the ground GND1 through the transistors $N11_0$ and $N12_0$.

Furthermore, where the memory cell $10_{0,0}$ is assigned to execute program operation, the word line $WL1_0$ and the signal P1 are at a VDD to respectively turn on the transistors $N15_0$ and $N13_0$. A voltage level of an inverting source line $SLB1_0$ is pulled down to the low voltage level of the ground GND1 by the transistor $N15_0$ and $N13_0$ within the first circuit $131_0$. The source line $SL1_0$ is latched at a high voltage level of a voltage source VPP1 through the latch circuit comprising the inverter $I11_0$ and $I12_0$. In addition, because the gate of the transistor $N12_0$ receives the signal PL1 having a GND, the turned-off transistor $N12_0$ isolates the ground GND1 and the source line $SL1_0$. Therefore, the source line $SL1_0$ is at a high voltage level and the memory cell $10_{0,0}$ can execute program operation.

As described above, each third circuit within the source line driving units comprises two transistors for controlling the voltage level of the corresponding source line and further controlling the corresponding memory cells.

Generally, the total size of the third circuits is proportional to the number of data input/output ports. That is, the size of the flash memory increases along with the increase of the number of data input/output ports. Recently, flash memory used for Field Programmable Gate Array (FPGA) applications require very wide data input/output buses. The cascade transistor structure of the third circuits within the source line driving units occupies a large area in a conventional flash memory.

SUMMARY OF THE INVENTION

Accordingly, an object of the present invention is to provide a source line driver for a flash memory.

According to the object described above, the present invention provides a source line driver for a flash memory to drive a plurality of source lines. Each source line is coupled to memory cells in a row. The source line driver comprises a plurality of source driving units and a control circuit. Each source driving units drives the corresponding source line and comprises a latch circuit, a first circuit and a second circuit.

The latch circuit is coupled between the corresponding source line and a corresponding inverting source line. The first circuit couples the corresponding source line to a common node when any memory cell is assigned to execute a program operation. The second circuit pulls down a voltage level of the corresponding inverting source line to a ground level when any memory cell is assigned to execute the program operation.

The control circuit is coupled between the common node and a ground line. When any memory cell is assigned to execute the program operation, the control circuit isolates the common node and the ground line. When none of the memory cells is assigned to execute program operation, the control circuit couples the common node to the ground line.

A detailed description is given in the following embodiments with reference to the accompanying drawings.

BRIEF DESCRIPTION OF THE DRAWINGS

The present invention can be more fully understood by reading the subsequent detailed description and examples wit references made to the accompanying drawings, wherein.

DETAILED DESCRIPTION OF THE INVENTION

Figure 1:
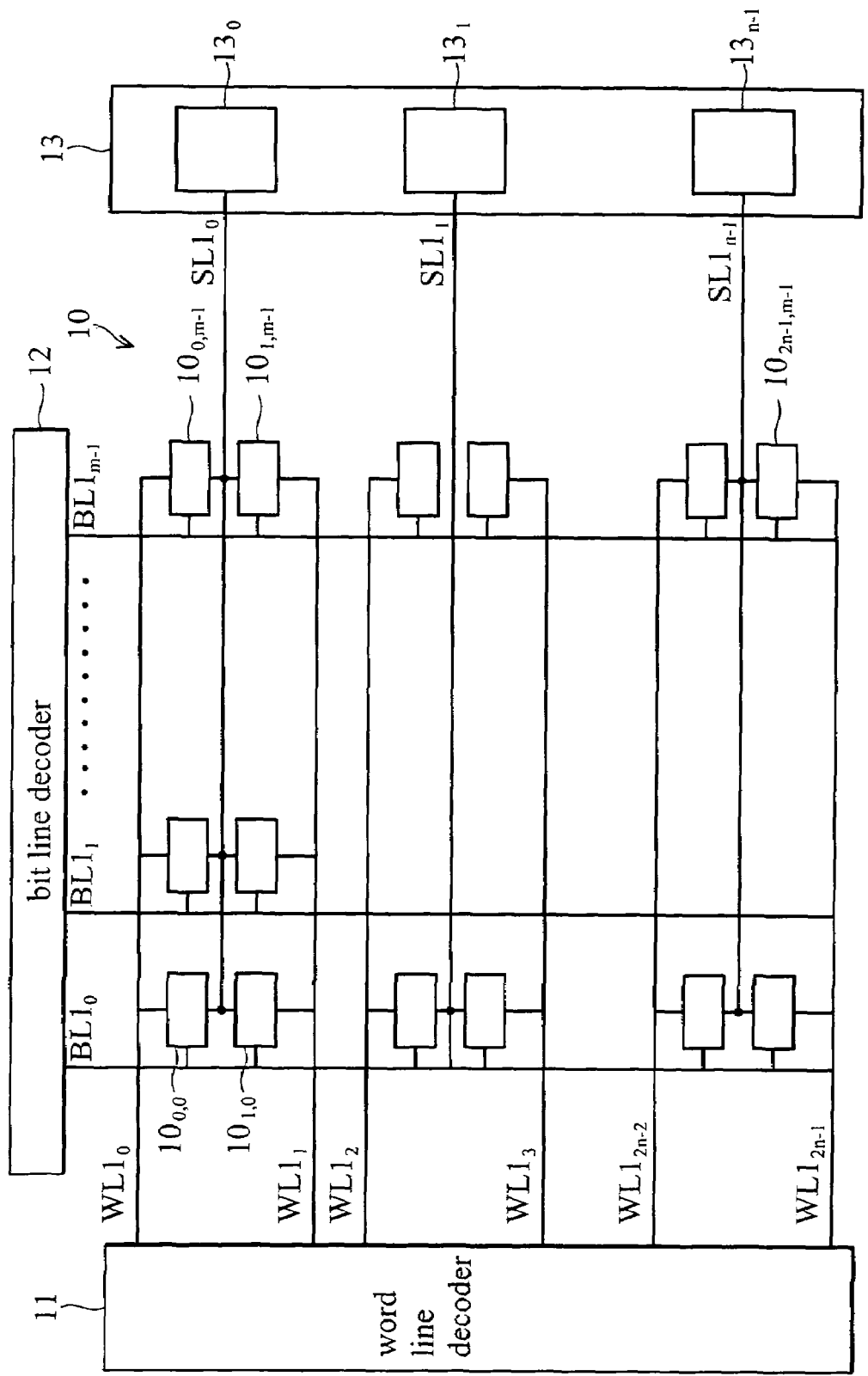
FIG. 1 is a basic structural diagram of a conventional flash memory.
Figure 2:
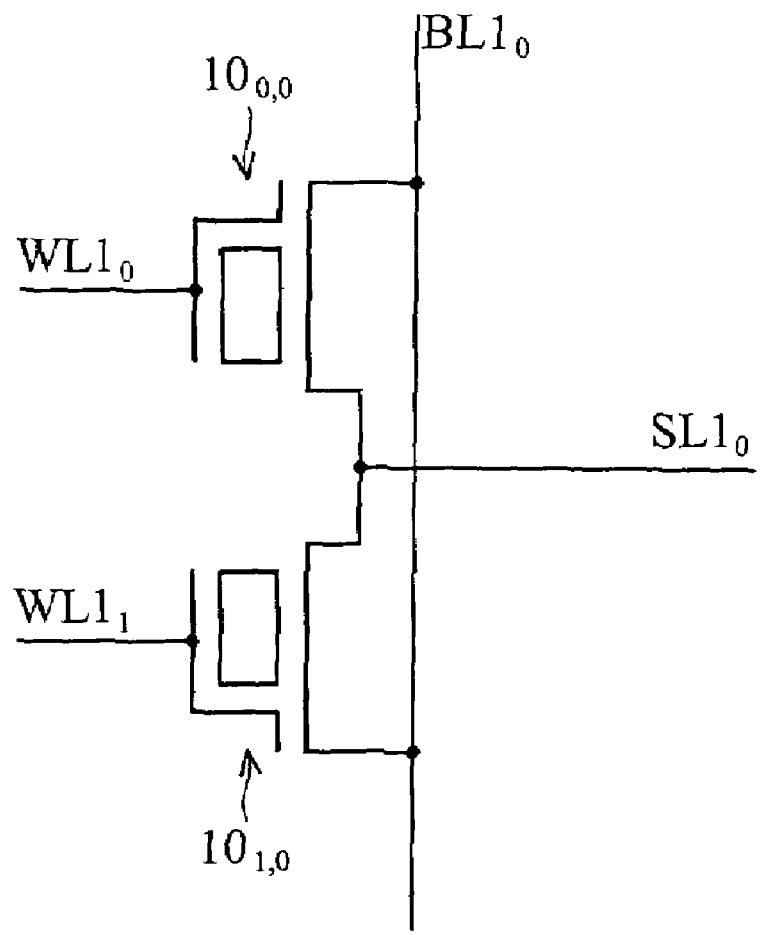
FIG. 2 shows an equivalent circuit of the memory units of the conventional flesh memory.
Figure 3:
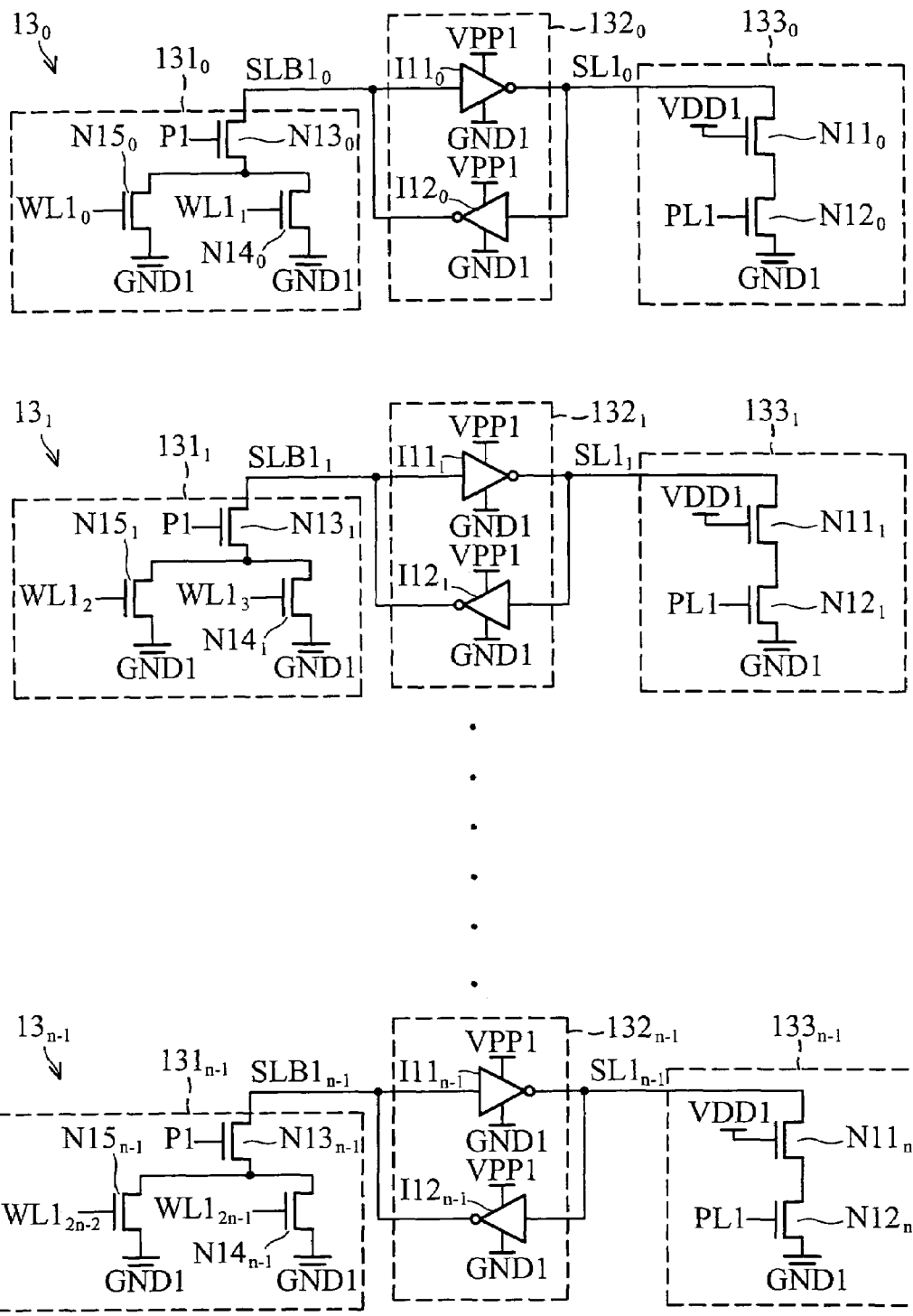
FIG. 3 is a schematic diagram of the source line driver of the conventional flash memory.
Figure 4:
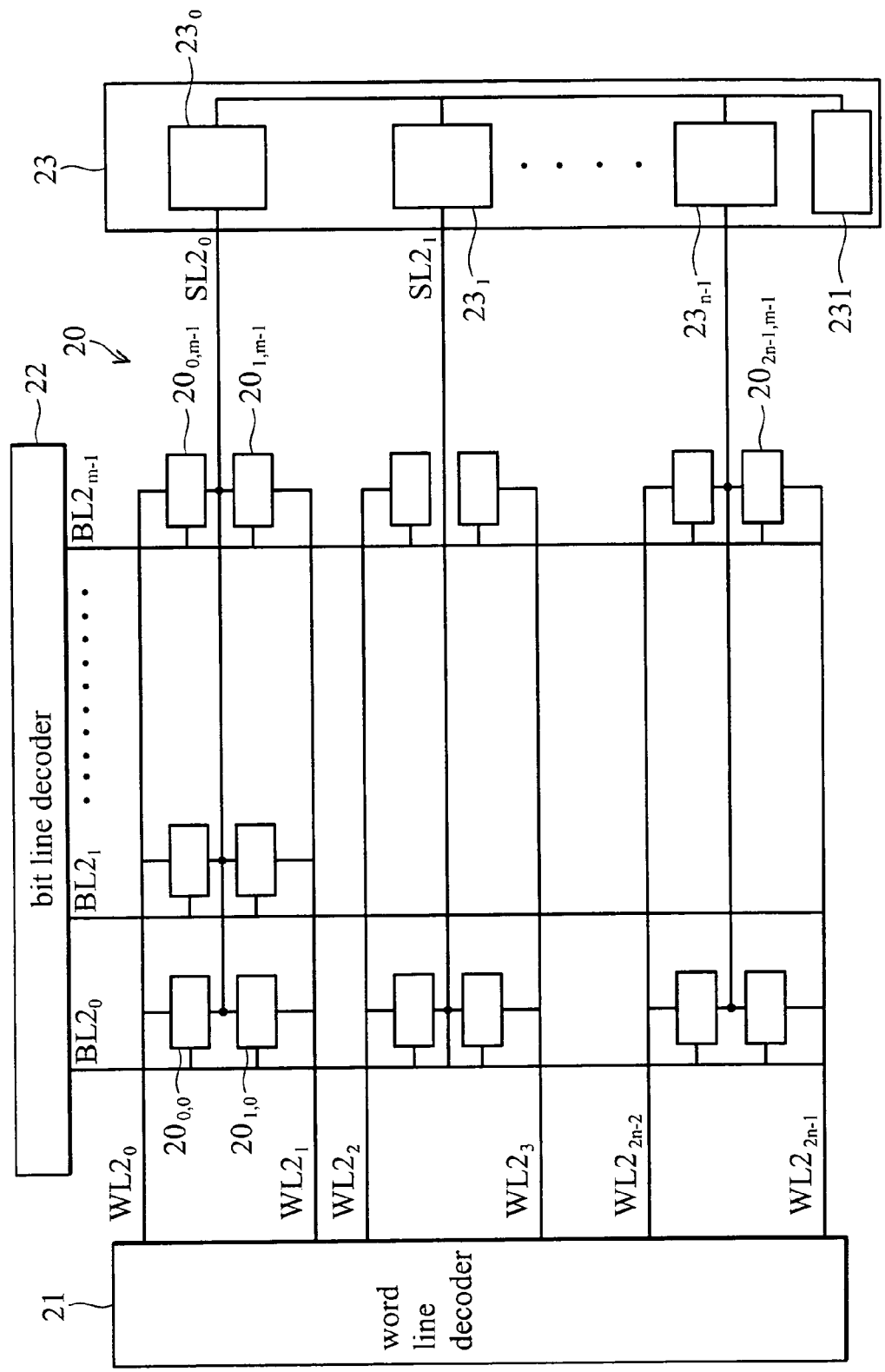
FIG. 4 is a schematic diagram of a flash memory according to one embodiment of the present invention.

FIG. 4 is a schematic diagram of a flash memory of the present invention. The flash memory comprises a memory array 20, a word line decoder 21, a bit line decoder 22, and a source line driver 23. A plurality of word lines $WL2_0$ to $WL2_{n-1}$ and bit lines $BL2_0$ to $BL2_{m-1}$ are interlaced forming the memory array 20. The source line driver 23 controls a plurality of source lines $SL2_0$ to $SL2_{n-1}$ and applies voltage to memory cells in two corresponding rows through the corresponding source line.

Figure 5:
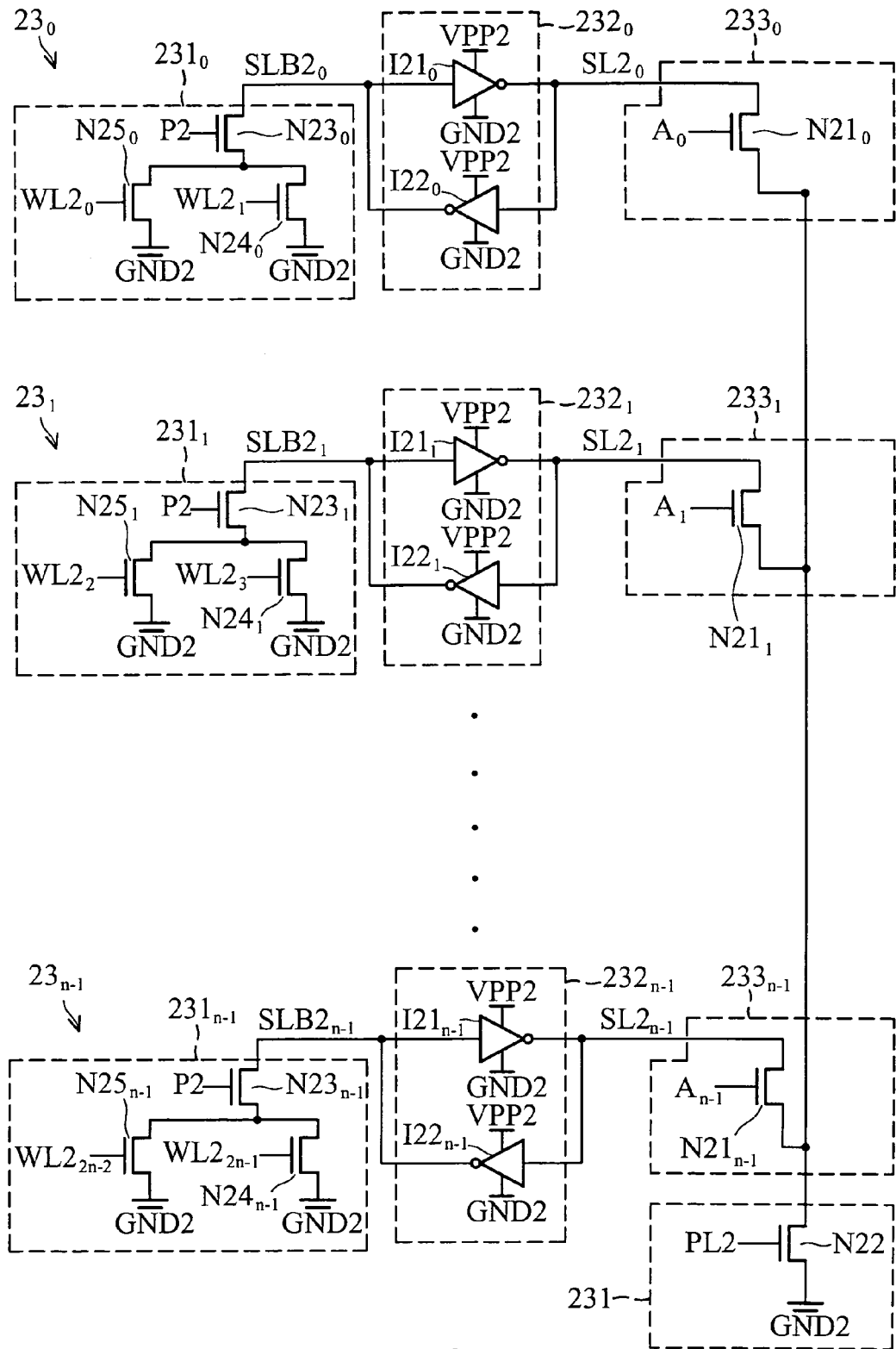
FIG. 5 is a schematic diagram of the source line driver according to one embodiment of the present invention.

FIG. 5 is a schematic diagram of the source line driver of the present invention. The source line driver 23 comprises a plurality of source line driving units $23_0$ to $23_{n-1}$ and a control circuit 231. The control circuit 231 comprises a transistor N22 having a drain coupled to a ground GND2 and a gate receiving a signal PL2. Referring to FIGS. 4 and 5, one source line driving unit controls one source line and applies voltage to memory cells in two corresponding rows through the corresponding source line. Each source line driving unit comprises three portions.

For example, the source line driving unit $23_0$ controls the source line $SL2_0$ coupled to memory cells $20_{0,0}$ to $20_{0,m-1}$ and $20_{1,0}$ to $20_{1,m-1}$. In the source line driving unit $23_0$, a second circuit $231_0$ comprises transistors $N23_0$, $N24_0$ and $N25_0$, a latch circuit $232_0$ comprises inverters $I21_0$ and $I22_0$, and a first circuit $233_0$ comprises transistors $N21_0$. In the second circuit $231_0$, a gate of the transistor $N25_0$ is coupled to the word line $WL2_1$ and a source thereof is coupled to the ground GND2; a gate of the transistor $N24_0$ receives a program signal P2, a source thereof is coupled to drains of the transistors $N24_0$ and $N25_0$, and a drain thereof is coupled to an inverting source line $SLB2_0$. In the latch circuit $232_0$, the inverters $I21_0$ and $I22_0$ operate at the voltage applied by voltage sources VPP2 and ground GND2, an input terminal of the inverters $I22_0$ are coupled to the inverting source line $SLB2_0$, and an output terminal of the inverters $I21_0$ and an input terminal of the inverters $I22_0$ are coupled to the source line $SL2_0$. In the first circuit $233_0$, a gate of the transistor $N21_0$ receives a signal $A_0$, a source thereof is coupled to a drain of the transistor N22, and a drain thereof is coupled to the source line $SL2_0$. It is noted that the program signal P2 and the signal PL2 are opposite to each other.

The source line driving unit $231_1$ controls the source line $SL2_1$ and applies voltage to the memory cells $20_{2,0}$ to $20_{2,m-1}$ and $20_{3,0}$ to $20_{3,m-1}$ through the source line $SL2_1$. In the source line driving unit $23_1$, a second circuit $231_1$ comprises transistors $N23_1$, $N24_1$ and $N25_1$, a latch circuit $232_1$ comprises inverters $I21_1$ and $I22_1$, and a first circuit $233_1$ comprises transistors $N21_1$. The structures of the circuits $231_1$ to $233_1$. The structures circuits $231_0$ to $233_0$.

In the embodiment of the present invention, all the transistors within the source line driving units $23_0$ to $23_{n-1}$ are N-type MOS transistors. Moreover, the circuitry structures of the source line driving units $23_3$ to $23_{n-1}$ are same as that of the source line driving unit $23_1$.

The source line driving units $23_0$ and $23_1$ are taken as an example to describe the embodiment of the present invention.

In the read and erase operations, the program signal is at a GND to turn off the transistors $N23_0$ and $23_1$, the signal PL2 is substantially at a VDD to turn on the transistor N22. Besides VDD, the voltage of the signal PL2 can be any value approximate to VDD as long as that value is sufficient to turn on the transistor N22. Both the signals $A_0$ and $A_1$ are substantially at a VDD to respectively turn on the transistors $N21_0$ and $N21_1$. Therefore, the source line is coupled to the ground GND2 through the transistors $N21_0$ and N22, and at the same time, any of the memory cells $20_{0,0}$ to $20_{0,m-1}$, $20_{1,0}$ to $20_{1,m-1}$, $20_{2,0}$ to $20_{2,m-1}$, and $20_{3,0}$ to $20_{3,m-1}$ can be selected to execute read or erase operations by the word lines $WL2_0$ to $WL2_3$.

In program operation, the program signal P2 is substantially at a VDD and the signal PL2 is at a GND, resulting in the transistors $N23_0$ to $N23_{n-1}$ are turned on and the transistor N22 is turned off. It is assumed that any of the memory cells $20_{0,0}$ to $20_{0,m-1}$ and $20_{1,0}$ to $20_{1,m-1}$, controlled by the source line driving unit $23_0$, are assigned to execute program operation, such as the memory cells $20_{0,0}$. The word line $WL2_0$ is at a VDD level to turn on the transistor $N25_0$, and the word line $WL2_1$ is at a low voltage level to turn off the transistor $N24_0$. A voltage level of the inverting source line $SLB2_0$ is pulled down to a low voltage level of the ground GND2. The source line $SL2_0$ is latched at the high voltage level of the voltage source VPP2 through the latch circuit $232_0$. Furthermore, because the memory cell $20_{0,0}$ controlled by the source line driving unit $23_0$ is assigned to execute program operation, the signal $A_0$ input to the source line driving unit $23_0$ is substantially at a VDD to turn on the transistor $N21_0$ applying an appropriate voltage drop to the source line $SL2_0$.

However, because the memory cell $20_{0,0}$ is not controlled by the source line driving unit $23_0$, the word lines $WL2_2$ and $WL2_3$ are at the GND to turn off the transistors $N24_1$ and $N25_1$ and the signal $A_1$ is at the GND to turn off the transistor $N21_1$. The source line $SL2_1$ is latched at the low voltage level of the ground GND2 through the latch circuit $232_1$.

As described above, the first circuit within each source line driving unit of the present invention comprises one transistor. In read and erase operation, the signals $A_0$ to $A_{n-1}$ are substantially at VDD to respectively turn on the transistors $N21_0$ to $N21_{n-1}$ and the signal PL2 is substantially at a VDD to turn on the transistor N22. Thus, the source lines $SL2_0$ to $SL2_{n-1}$ are coupled to the ground GND2 through the turned-on transistor $N21_0$ to $N21_{n-1}$ and N22.

In program operation, the signal PL2 is at a GND to turn off the transistor N22. In the source line driving unit corresponding to the memory cell assigned to execute program operation, the transistor, whose gate receives a signal substantially equal to a VDD, within the first circuit is turned on. However, in other source line driving units, the transistors, whose gates receive signals having a GND, within the first circuits are turned off. Thus, the source line corresponding to the memory cell assigned to execute program operation is isolated from the ground GND2 by the turned-off transistors N22 and the turned-off transistor within the first circuit.

Table 1 shows the voltage levels of the signals $A_0$ to $A_{n-1}$, PL2, and P2 in different operations. A label "1" substantially represents the VDD and a label "0" the GND. As shown in Table 1, in read and erase operations, the signals $A_0$ to $A_{n-1}$ are substantially at the VDD "1" and the signal PL2 is substantially also at the VDD "1". Thus, the transistors N22 and $N21_0$ to $N21_{n-1}$ are turned on. In program operation, it is assumed that the memory cell $20_{0,0}$ is assigned to execute program, the signal $A_0$ is substantially at the VDD "1" and the signals PL2 and $A_1$ to $A_{n-1}$ are at GND "0". Thus, the transistor $N21_0$ is turned on, and the transistors N22 $N21_1$ to $N21_{n-1}$ are turned on.

It is assumed that size of each transistor within the present invention and the conventional technology is S. Sizes of second circuits of the present invention and the conventional technology are the same, and the size of each latch circuit of the present invention is the same as size of each first circuit of the conventional technology. Considering only the sizes of the first circuits $233_0$ to $233_{n-1}$ of the present invention and the sizes of the third circuits $133_0$ to $133_{n-1}$ of the conventional technology, size of the source driver 23 of the present invention is $(n+1)^*S$ while the size of the source driver 13 of the conventional technology is $2^*n^*S$. Therefore, the present invention provides a small source line driver reducing occupied space in the flash memory.

TABLE 1

| operation signal | erase | read | program |
|---|---|---|---|
| $A_0$ | 1 | 1 | 1 |
| $A_1$ | 1 | 1 | 0 |
| $A_2$ | 1 | 1 | 0 |
| . | . | . | . |
| . | . | . | . |
| . | . | . | . |
| $A_{2n-1}$ | 1 | 1 | 0 |
| PL2 | 1 | 1 | 0 |
| P2 | 0 | 0 | 1 |

It is assumed that the memory cell $20_{0,0}$ is assigned to execute program.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A source line driver for a flash memory to drive a plurality of source lines, each source line coupled to memory cells in a row, the source line driver comprising:
    a plurality of source driving units, each driving a corresponding source line and comprising:
        a latch circuit coupled between the corresponding source line and a corresponding inverting source line; and
        a first circuit coupling the corresponding source line to a common node when any memory cell is assigned to execute a program operation; and
    a control circuit coupled between the common node and a ground line, isolating the common node and the ground line when any memory cell is assigned to execute the program operation, and coupling the common node to the ground line when none of the memory cells is assigned to execute the program operation.

2. The source line driver as claimed in claim 1, wherein the first circuit comprises a first MOS transistor with two drain/source terminals respectively coupled to the corresponding source line and the common node and the first MOS transistor is turned on when any memory cell is assigned to execute the program operation.

3. The source line driver as claimed in claim 2, wherein the control circuit comprises a second MOS transistor.

4. The source line driver as claimed in claim 3, wherein when any memory cell is assigned to execute the program operation, the first MOS transistor is turned on and the second MOS transistor is turned off.

5. The source line driver as claimed in claim 3, wherein when any memory cell is assigned to execute the program operation, the gate terminal of the first MOS transistor receives a signal substantially equal to VDD, and a gate terminal of the second MOS transistor receives a signal whose voltage is GND.

6. The source line driver as claimed in claim 3, wherein when any memory cell is assigned to execute the program operation, the first MOS transistors in the source driving units not corresponding to the expected-to-be-programmed memory cell are turned off and the second MOS transistor is turned off.

7. The source line driver as claimed in claim 3, wherein when any memory cell is assigned to execute the program operation, the gate terminals of the first MOS transistors in the source driving units not corresponding to a expected-to-be-programmed memory cell receive signals substantially equal to VDD, and a gate terminal of the second MOS transistor receives a signal substantially equal to VDD.

8. The source line driver as claimed in claim 3, wherein when none of the memory cells is assigned to execute the program operation, the first MOS transistors in all source driving units and the second MOS transistor are turned on.

9. The source line driver as claimed in claim 3, wherein when none of the memory cells is assigned to execute the program operation, the gate terminals of the first MOS transistor in all source driving units and the gate terminal of the second MOS transistor receive a signal substantially equal to VDD.

10. The source line driver as claimed in claim 1, wherein each source driving unit further comprises a second circuit pulling down a voltage level of the corresponding inverting source line to a ground level when any memory cell is assigned to execute the program operation.

11. The source line driver as claimed in claim 10, wherein the second circuit comprises:
    a third MOS transistor having two drain/source terminals respectively coupled to the ground line and a first node and a gate terminal coupled to a first word line;
    a fourth MOS transistor having two drain/source terminals respectively coupled to the ground line and the first node and a gate terminal coupled to a second word line; and
    a fifth MOS transistor having two drain/source terminals respectively coupled to the first node and the corresponding inverting source line and a gate terminal, wherein when any memory cell is assigned to execute the program operation, either the third or fourth MOS transistor is turned on, and the fifth MOS transistor is turned on to pull down the voltage level of the corresponding inverting source line to the ground level.

12. The source line driver as claimed in claim 11, wherein when any memory cell is assigned to execute the program operation, the first or second word line is enabled and the gate terminal of the fifth MOS transistor receives a program signal.

13. The source line driver as claimed in claim 12, wherein when any memory cell is assigned to execute the program operation, the first or second word line is at a high voltage level and the program signal is at the high voltage level.

14. The source line driver as claimed in claim 12, wherein when any memory cell is assigned to execute the program operation, the control circuit receives a signal opposite to the program signal.

15. The source line driver as claimed in claim 10, wherein when none of the memory cells is assigned to execute the program operation, the second circuit receives a program signal, and the control circuit receives a signal opposite to the program signal so that the control circuit isolating the common node and the ground line.

16. A flash memory comprising:
   a word line decoder controlling a plurality of word lines;
   a bit line decoder controlling a plurality of bit lines;
   a memory array comprising a plurality of memory cells formed by the interlaced word lines and bit lines; and
   a source line driver driving a plurality of source lines, each source line coupled to the memory cells in a row, the source line driver comprising:
      a plurality of source driving units, each driving a corresponding source line and comprising:
         a latch circuit coupled between the corresponding source line and a corresponding inverting source line; and
         a first circuit coupling the corresponding source line to a common node when any memory cell is assigned to execute a program operation; and
      a control circuit coupled between the common node and a ground line, isolating the common node and the ground line when any memory cell is assigned to execute the program operation, and coupling the common node to the ground line when none of the memory cells is assigned to execute the program operation.

17. The flash memory as claimed in claim 16, wherein the first circuit comprises a first MOS transistor with two drain/source terminals respectively coupled to the corresponding source line and the common node and the first MOS transistor is turned on when any memory cell is assigned to execute the program operation.

18. The flash memory is claimed in claim 16, wherein the control circuit comprises a second MOS transistor.

19. The flash memory as claimed in claim 16, wherein each source driving unit further comprises a second circuit pulling down a voltage level of the corresponding inverting source line to a ground level when any memory cell is assigned to execute the program operation.

20. The flash memory is claimed in claim 19, wherein the second circuit comprises:
   a third MOS transistor having two drain/source terminals respectively coupled to the ground line and a first node and a gate terminal coupled to a first word line;
   a fourth MOS transistor having two drain/source terminals respectively coupled to the ground line and the first node and a gate terminal coupled to a second word line; and
   a fifth MOS transistor having two drain/source terminals respectively coupled to the first node and the corresponding inverting source line and a gate terminal, wherein when any memory cell is assigned to execute the program operation, either the third or fourth MOS transistor is turned on, and the fifth MOS transistor is turned on to pull down the voltage level of the corresponding inverting source line to the ground level.

* * * * *